(12) United States Patent
Zhang et al.

(10) Patent No.: US 12,278,612 B2
(45) Date of Patent: *Apr. 15, 2025

(54) CASCADED RESONATOR HAVING REFLECTOR ELECTRODES WITH DIFFERENT PITCHES

(71) Applicant: SKYWORKS SOLUTIONS, INC., Irvine, CA (US)

(72) Inventors: Xiao Zhang, Irvine, CA (US); Tomoya Komatsu, Irvine, CA (US); Yiliu Wang, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/419,025

(22) Filed: Jan. 22, 2024

(65) Prior Publication Data

US 2024/0162880 A1 May 16, 2024

Related U.S. Application Data

(63) Continuation of application No. 17/093,761, filed on Nov. 10, 2020, now Pat. No. 11,881,836.

(60) Provisional application No. 62/940,075, filed on Nov. 25, 2019.

(51) Int. Cl.
| | | |
|---|---|---|
| *H03H 9/02* | (2006.01) | |
| *H03H 9/00* | (2006.01) | |
| *H03H 9/145* | (2006.01) | |
| *H03H 9/25* | (2006.01) | |
| *H03H 9/64* | (2006.01) | |
| *H03H 9/72* | (2006.01) | |
| *H04B 1/38* | (2015.01) | |

(52) U.S. Cl.
CPC ...... *H03H 9/02685* (2013.01); *H03H 9/0009* (2013.01); *H03H 9/145* (2013.01); *H03H 9/25* (2013.01); *H03H 9/6483* (2013.01); *H03H 9/6496* (2013.01); *H03H 9/725* (2013.01); *H04B 1/38* (2013.01)

(58) Field of Classification Search
CPC .. H03H 9/02685; H03H 9/0009; H03H 9/145; H03H 9/25; H03H 9/6483; H03H 9/6496; H03H 9/725
USPC .................................................. 333/186, 183
See application file for complete search history.

(56) References Cited

U.S. PATENT DOCUMENTS

| | | |
|---|---|---|
| 11,569,433 B2 | 1/2023 | Shimomura et al. |
| 11,881,836 B2 * | 1/2024 | Zhang ............... H03H 9/6496 |
| 2005/0190014 A1 | 9/2005 | Saitou et al. |
| 2008/0018417 A1 * | 1/2008 | Igaki ............... H03H 9/02559 |
| | | 333/195 |

(Continued)

*Primary Examiner* — Rakesh B Patel
(74) *Attorney, Agent, or Firm* — Lando & Anastasi, LLP

(57) ABSTRACT

An acoustic wave device comprises a piezoelectric substrate, interdigital transducer electrodes having an electrode pitch $\lambda_0$, and first and second reflector gratings disposed on opposite respective sides of the interdigital transducer electrodes in a propagation direction of a main acoustic wave through the acoustic wave device, the first reflector grating having a reflector electrode pitch $\lambda_1$ throughout an entirety of the first reflector grating that is different than a reflector electrode pitch $\lambda_2$ throughout an entirety of the second reflector grating to suppress ripples in a conductance curve of the acoustic wave device.

13 Claims, 12 Drawing Sheets

(56) References Cited

U.S. PATENT DOCUMENTS

| | | |
|---|---|---|
| 2014/0049341 A1 | 2/2014 | Komatsu et al. |
| 2016/0049920 A1 | 2/2016 | Kishino |
| 2017/0331457 A1 | 11/2017 | Satoh |
| 2018/0109238 A1 | 4/2018 | Yamaji et al. |
| 2019/0238116 A1 | 8/2019 | Takamine |
| 2020/0195230 A1* | 6/2020 | Nosaka ................ H03H 9/6483 |
| 2020/0287519 A1 | 9/2020 | Kishino et al. |
| 2020/0403603 A1* | 12/2020 | Daimon ............. H03H 9/02559 |
| 2021/0152153 A1 | 5/2021 | Kishino |
| 2021/0159878 A1 | 5/2021 | Zhang et al. |

\* cited by examiner

CASCADED RESONATOR HAVING REFLECTOR ELECTRODES WITH DIFFERENT PITCHES

CROSS-REFERENCE TO RELATED APPLICATIONS

This application claims priority under 35 U.S.C. § 120 as a continuation of U.S. patent application Ser. No. 17/093,761, titled "CASCADED RESONATOR WITH DIFFERENT REFLECTOR PITCH," filed Nov. 10, 2020 which claims priority under 35 U.S.C. § 119(e) to U.S. Provisional Patent Application Ser. No. 62/940,075, titled "CASCADED RESONATOR WITH DIFFERENT REFLECTOR PITCH," filed Nov. 25, 2019, the content of each being incorporated herein by reference in its entirety for all purposes.

BACKGROUND

Technical Field

Embodiments of this disclosure relate to acoustic wave devices and electronic devices including same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer or a diplexer. Multiple acoustic wave filters can be connected to work as a multiplexer, which may be used for carrier aggregation (CA) in LTE Advanced.

SUMMARY

In accordance with one aspect, there is provided an acoustic wave device. The acoustic wave device comprises a piezoelectric substrate, interdigital transducer electrodes having an electrode pitch $\lambda_0$, and first and second reflector gratings disposed on opposite respective sides of the interdigital transducer electrodes in a propagation direction of a main acoustic wave through the acoustic wave device, the first reflector grating having a different electrode pitch $\lambda_1$ than an electrode pitch $\lambda_2$ of the second reflector grating to suppress ripples in a conductance curve of the acoustic wave device.

In some embodiments, one of $\lambda_1$ or $\lambda_2$ is equal to $\lambda_0$.

In some embodiments, each of $\lambda_1$ and $\lambda_2$ is different from $\lambda_0$. Each of $\lambda_1$ and $\lambda_2$ may be greater than $\lambda_0$. Each of $\lambda_1$ and $\lambda_2$ may be greater than $\lambda_0$ by between about 2% and about 5%.

In some embodiments, the acoustic wave device further comprises second interdigital transducer electrodes in series with the interdigital transducer electrodes, and third and fourth reflector gratings disposed on opposite respective sides of the second interdigital transducer electrodes in the propagation direction, the third reflector grating having a different electrode pitch $\lambda_3$ than an electrode pitch $\lambda_4$ of the fourth reflector grating.

In some embodiments, $\lambda_1$ is equal to one of $\lambda_3$ or $\lambda_4$.

In some embodiments, $\lambda_2$ is equal to one of $\lambda_3$ or $\lambda_4$.

In some embodiments, each of $\lambda_1$, $\lambda_2$, $\lambda_3$, and $\lambda_4$ is different.

In accordance with another aspect, there is provided an electronic device including at least two filters coupled to an antenna node, a first of the at least two filters being a ladder filter having a series resonator closest to the antenna node. The series resonator comprises a piezoelectric substrate, interdigital transducer electrodes having an electrode pitch $\lambda_0$, and first and second reflector gratings disposed on opposite respective sides of the interdigital transducer electrodes in a propagation direction of a main acoustic wave through the acoustic wave device, the first reflector grating having a different electrode pitch $\lambda_1$ than an electrode pitch $\lambda_2$ of the second reflector grating to suppress ripples in a conductance curve of the series resonator.

In some embodiments, each of $\lambda_1$ and $\lambda_2$ is greater than $\lambda_0$. Each of $\lambda_1$ and $\lambda_2$ may be greater than $\lambda_0$ by between about 2% and about 5%.

In some embodiments, the electronic device further comprises second interdigital transducer electrodes in series with the interdigital transducer electrodes, and third and fourth reflector gratings disposed on opposite respective sides of the second interdigital transducer electrodes in the propagation direction, the third reflector grating having a different electrode pitch $\lambda_3$ than an electrode pitch $\lambda_4$ of the fourth reflector grating.

In some embodiments, each of $\lambda_1$, $\lambda_2$, $\lambda_3$, and $\lambda_4$ is different.

In some embodiments, each of $\lambda_3$, and $\lambda_4$ is greater than an electrode pitch of the second interdigital transducer electrodes.

In some embodiments, one of $\lambda_1$ or $\lambda_2$ is equal to one of $\lambda_3$ or $\lambda_4$.

In accordance with another aspect, there is provided a radio frequency filter including an acoustic wave resonator. The acoustic wave resonator comprises a piezoelectric substrate, interdigital transducer electrodes having an electrode pitch $\lambda_0$, and first and second reflector gratings disposed on opposite respective sides of the interdigital transducer electrodes in a propagation direction of a main acoustic wave through the acoustic wave device, the first reflector grating having a different electrode pitch $\lambda_1$ than an electrode pitch $\lambda_2$ of the second reflector grating to suppress ripples in a conductance curve of the acoustic wave resonator.

In some embodiments, each of $\lambda_1$ and $\lambda_2$ is greater than $\lambda_0$. Each of $\lambda_1$ and $\lambda_2$ may be greater than $\lambda_0$ by between about 2% and about 5%.

In accordance with another aspect, there is provided an electronics module including a radio frequency filter including an acoustic wave resonator. The acoustic wave resonator comprises a piezoelectric substrate, interdigital transducer electrodes having an electrode pitch $\lambda_0$, and first and second reflector gratings disposed on opposite respective sides of the interdigital transducer electrodes in a propagation direction of a main acoustic wave through the acoustic wave device, the first reflector grating having a different electrode pitch $\lambda_1$ than an electrode pitch $\lambda_2$ of the second reflector grating to suppress ripples in a conductance curve of the acoustic wave resonator.

In accordance with another aspect, there is provided an electronic device. The electronics device comprises an electronics module including a radio frequency filter, the radio frequency filter including an acoustic wave resonator. The acoustic wave resonator includes a piezoelectric substrate, interdigital transducer electrodes having an electrode pitch $\lambda_0$, and first and second reflector gratings disposed on opposite respective sides of the interdigital transducer electrodes in a propagation direction of a main acoustic wave through the acoustic wave device, the first reflector grating having a different electrode pitch $\lambda_1$ than an electrode pitch $\lambda_2$ of the second reflector grating to suppress ripples in a conductance curve of the acoustic wave resonator.

In some embodiments, one of $\lambda_1$ or $\lambda_2$ is equal to $\lambda_0$.

In some embodiments, each of $\lambda_1$ and $\lambda_2$ is different from $\lambda_0$.

In some embodiments, each of $\lambda_1$ and $\lambda_2$ is greater than $\lambda_0$.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
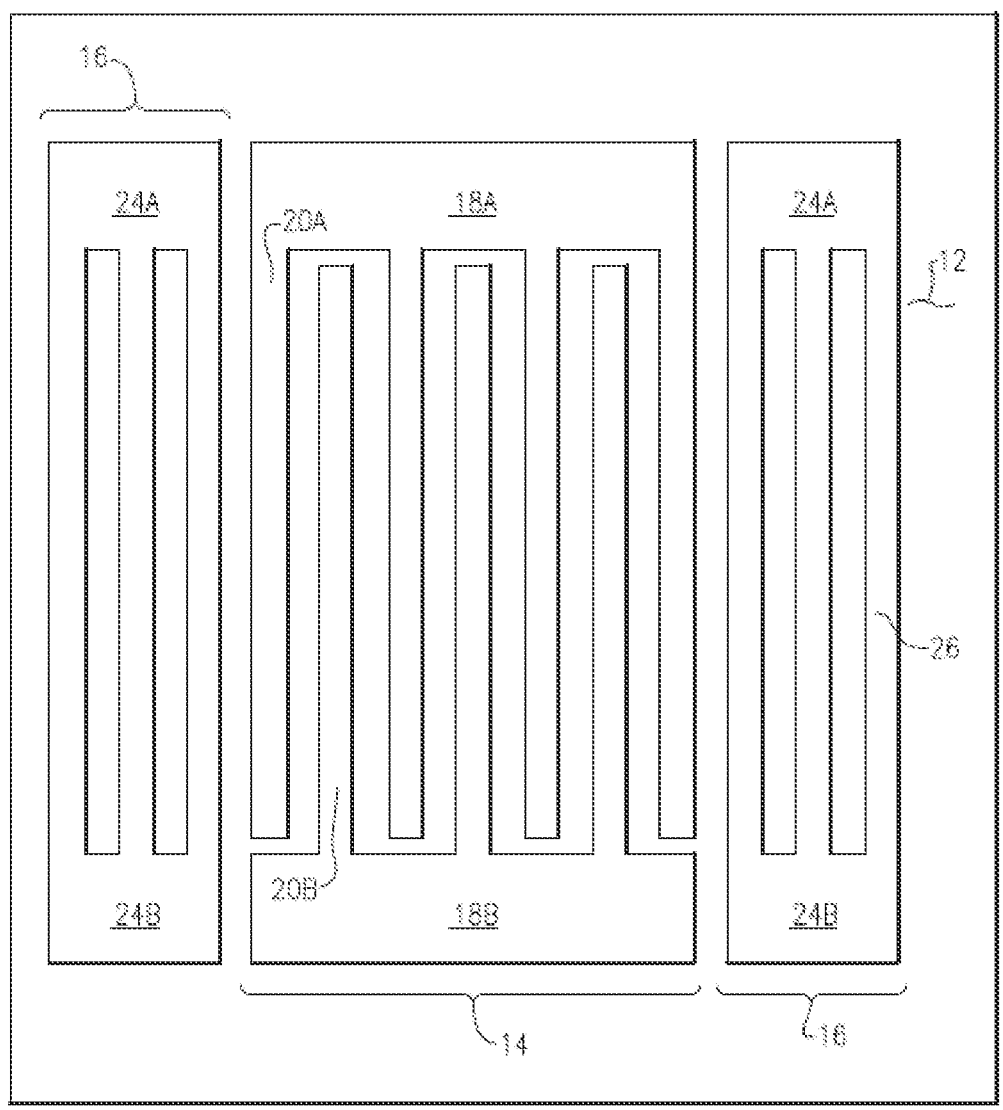
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, diplexer, balun, etc.

Acoustic wave resonator 10 is formed on a piezoelectric substrate, for example, a lithium tantalate ($LiTaO_3$) or lithium niobate ($LiNbO_3$) substrate 12 and includes Interdigital Transducer (IDT) electrodes 14 and reflector electrodes 16. In use, the IDT electrodes 14 excite a main acoustic wave having a wavelength $\lambda$ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
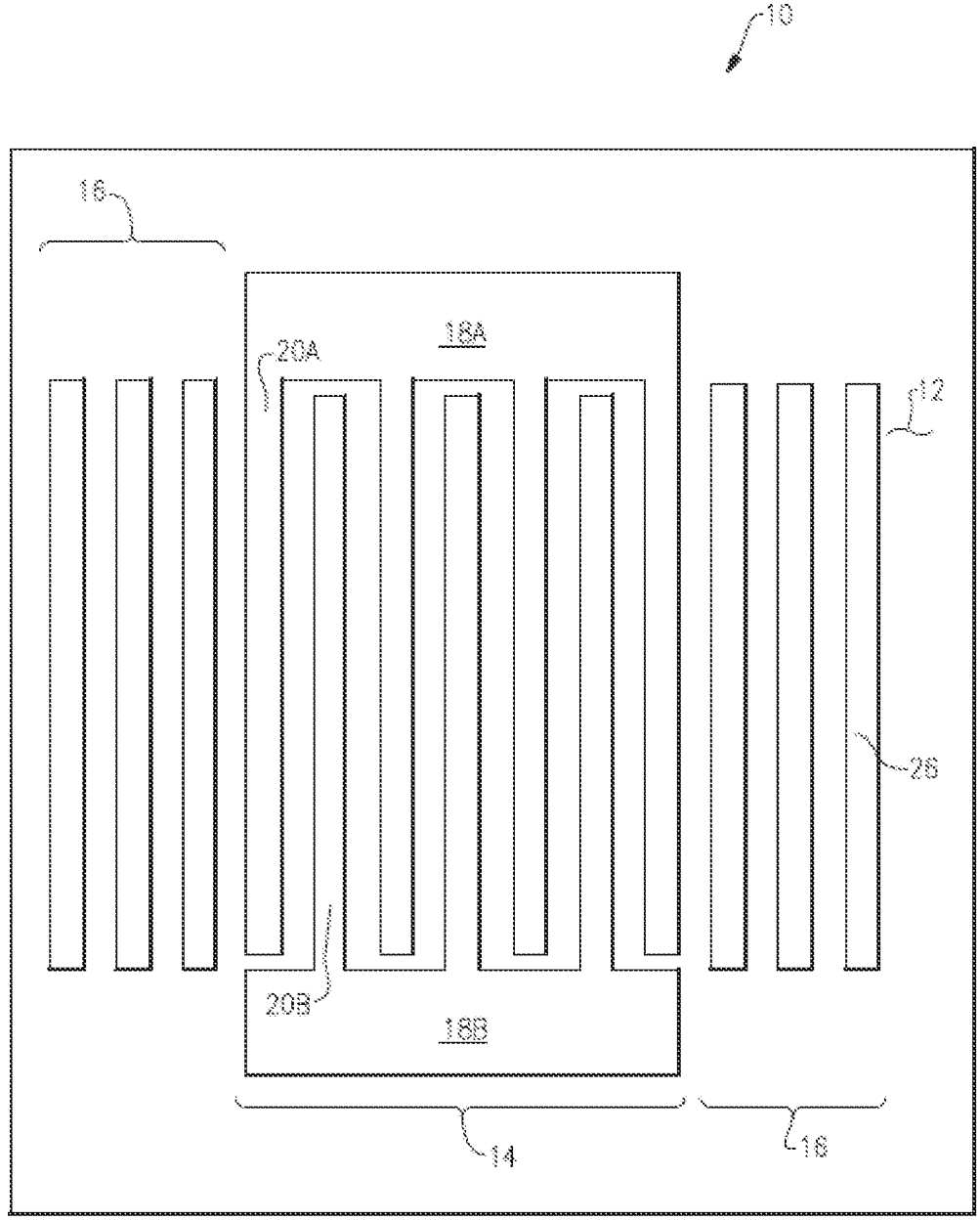
FIG. 1B is a simplified plan view of another example of a surface acoustic wave resonator.
Figure 1C:
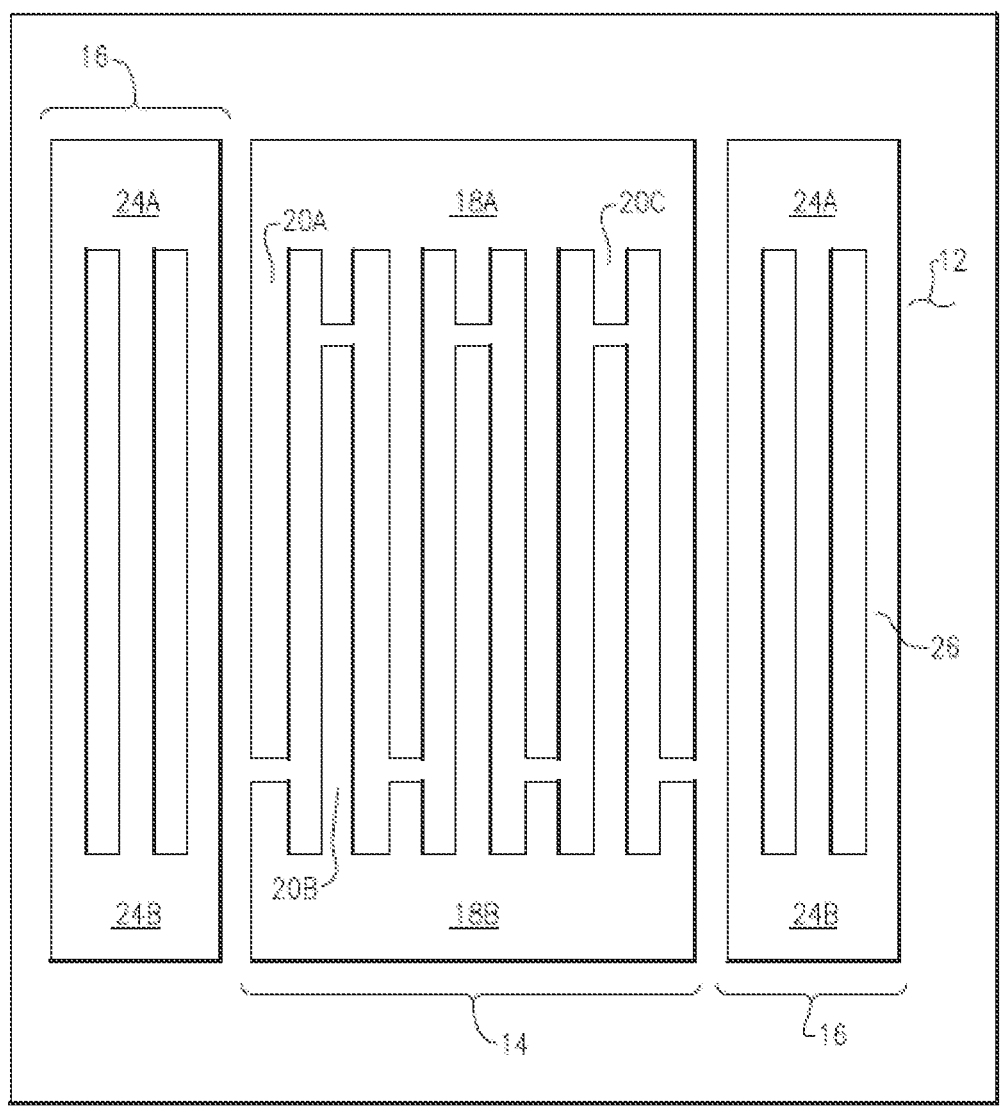
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators illustrated in FIGS. 1A-1C, as well as those illustrated in other figures presented herein, are illustrated in a highly simplified form. The relative dimensions of the different features are not shown to scale. Further, typical acoustic wave resonators would commonly include a far greater number of electrode fingers and/or reflector fingers than illustrated. The acoustic wave resonators may be configured differently than illustrated in some examples, for example, to include dummy electrode fingers, electrode fingers with different or non-uniform length or width dimensions, electrode fingers or reflector fingers with different or non-uniform spacing, or electrode fingers that include bent or tilted portions. Typical acoustic wave resonators or filter elements may also include multiple IDT electrodes sandwiched between the reflector electrodes.

Figure 2:
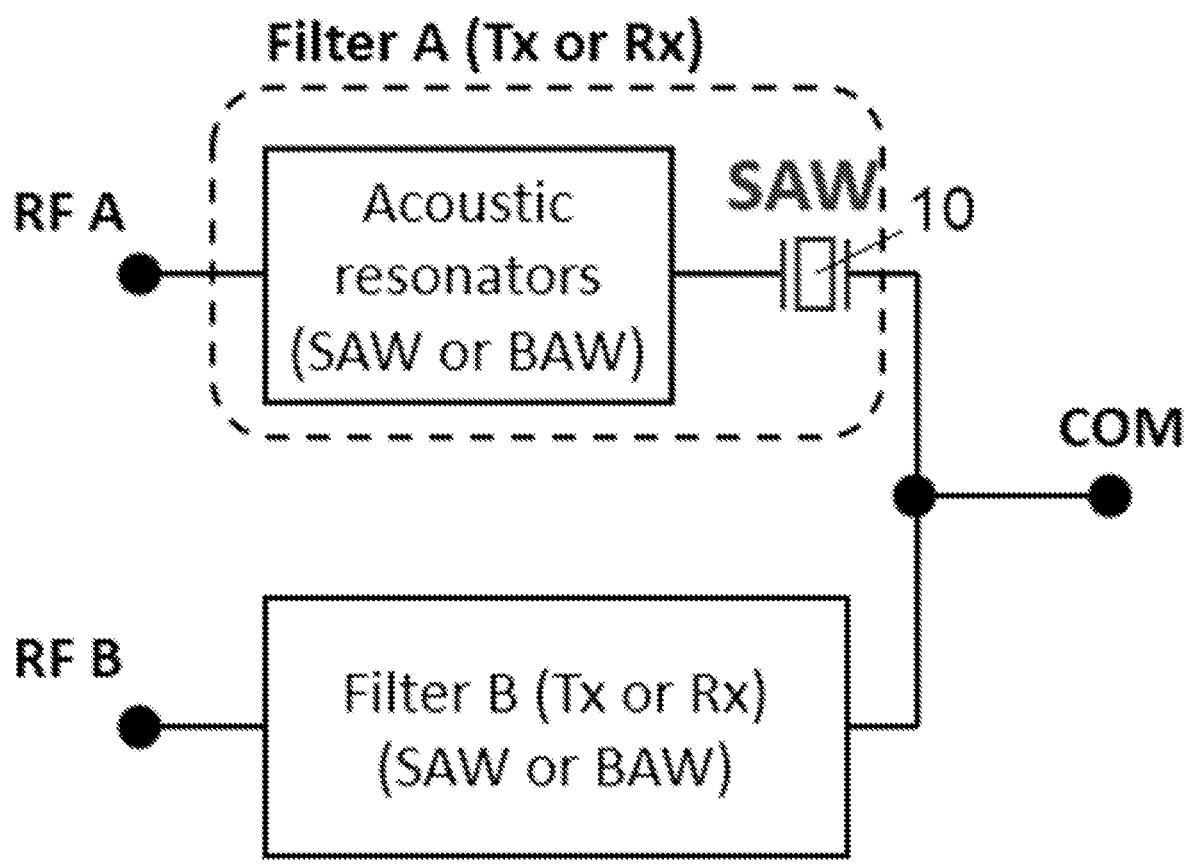
FIG. 2 illustrates an arrangement of filters in an example of an electronic device.

Many radio frequency (RF) electronic devices, for example, cellular telephones, may include multiple filters electrically coupled to the same node, for example, to an antenna. The multiple filters may be formed from or include acoustic resonators, for example, SAW resonators and/or bulk acoustic wave (BAW) resonators. The different filters may include, for example, a receive filter and a transmit filter and/or multiple transmit and/or receive filters that operate in different frequency bands. In some embodiments the different filters may form a duplexer. One simplified example is illustrated in FIG. 2 in which two RF filters, Filter A and Filter B are electrically connected to the same node, also referred to as a common node (COM) which may in turn be connected to an antenna. Although illustrated as being directly connected to the COM node, it should be appreciated that in other embodiments a switch may be used to selectively connect one of Filter A or Filter B to the COM node at different times. The nodes RF A and RF B illustrated in FIG. 2 may be coupled to a transmission circuitry for providing an RF signal to the respective filter or may be coupled to receive circuitry to receive an RF signal from the respective filter, depending on whether Filter A and/or Filter B are transmit or receive filters. As illustrated in FIG. 2 Filter A, and optionally Filter B as well, may include a series SAW resonator 10 with a terminal (input or output) electrically coupled to the common node. In some embodiments, the SAW resonator 10 may be a temperature compensated (TC) Rayleigh mode SAW resonator (TC-SAW).

A series resonator closest to a common node in a device, such as SAW resonator 10 in FIG. 2, will be referred to as a first series acoustic resonator or first SAW resonator herein.

Figure 3:
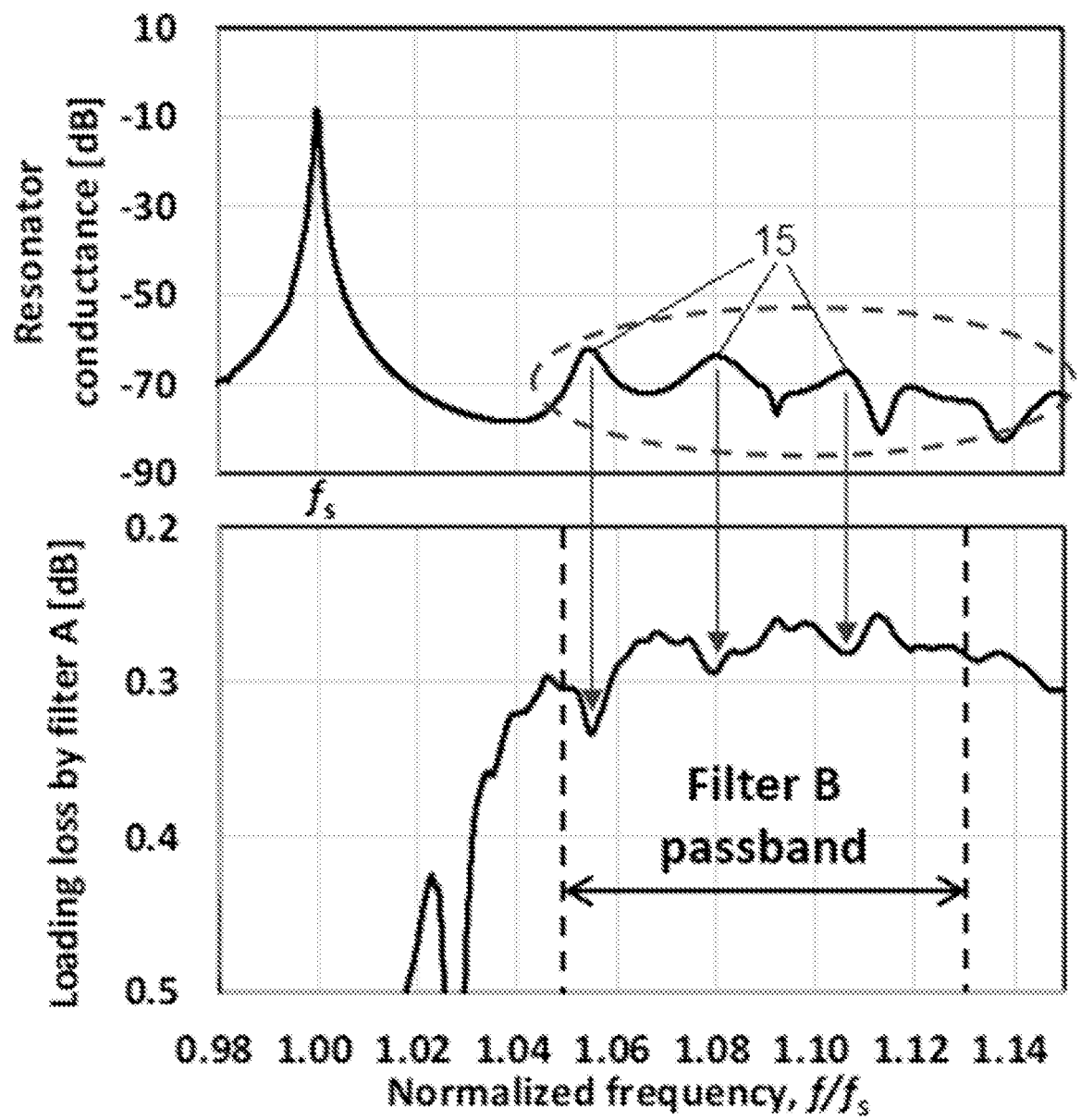
FIG. 3 illustrates degradation in the passband of one of the filters of FIG. 2 that may be caused by ripples that may be generated in a conductance curve of a resonator of the other of the filters of FIG. 2.

As illustrated in FIG. 3, the SAW resonator 10 may exhibit a conductance curve with a peak at a resonant frequency $f_s$. The conductance curve of the SAW resonator 10 may also exhibit ripples 15 at frequencies above the resonant frequency and above the stop band of the reflector electrodes of the SAW resonator 10. Without being limited to a particular theory, it is believed that the ripples 15 are caused by the stopband mode of the reflector electrodes 16. As there are a finite number of electrode fingers 26 in each reflector electrode 16, for frequencies above the stopband, acoustic wave leakage may occur. If the ripples 15 are at frequencies within a passband of Filter B, the ripples may degrade the passband characteristics of Filter B and increase the loading loss of Filter B at frequencies at which the ripples are present as also illustrated in FIG. 3. Similarly, ripples in the conductance curve of a resonator electrically coupled to the common node in Filter B may degrade the passband characteristics of Filter A and increase the loading loss of Filter A at frequencies at which the ripples are present.

Various solutions to the problem of ripples in the conductance curve of a series resonator in one filter degrading the passband characteristics of another filter in the same device as the first filter have been proposed. The characteristics of the first series acoustic resonator in a filter in a device may be optimized to exhibit smaller conductance at frequencies within the passband or passbands of another filter or of other filters in the same device. In one example, a single first series acoustic resonator in a filter may be split into two different resonators in series (cascaded resonators) to reduce the acoustic energy leak. In another example, the aspect ratio of the first series acoustic resonator in a filter can be changed so that the first series acoustic resonator is long and thin to reduce energy leakage outside of the stopband of the reflector electrodes of the resonator. In a further example, the first series acoustic resonator in a filter may be designed to shift the reflector ripples out of the passbands of other filters in a device by utilizing heavy and thick reflector electrodes to make the reflector stopband frequency width wider and to push out the frequencies at which the ripples occur or by utilizing a smaller reflector electrode pitch.

Figure 4A:
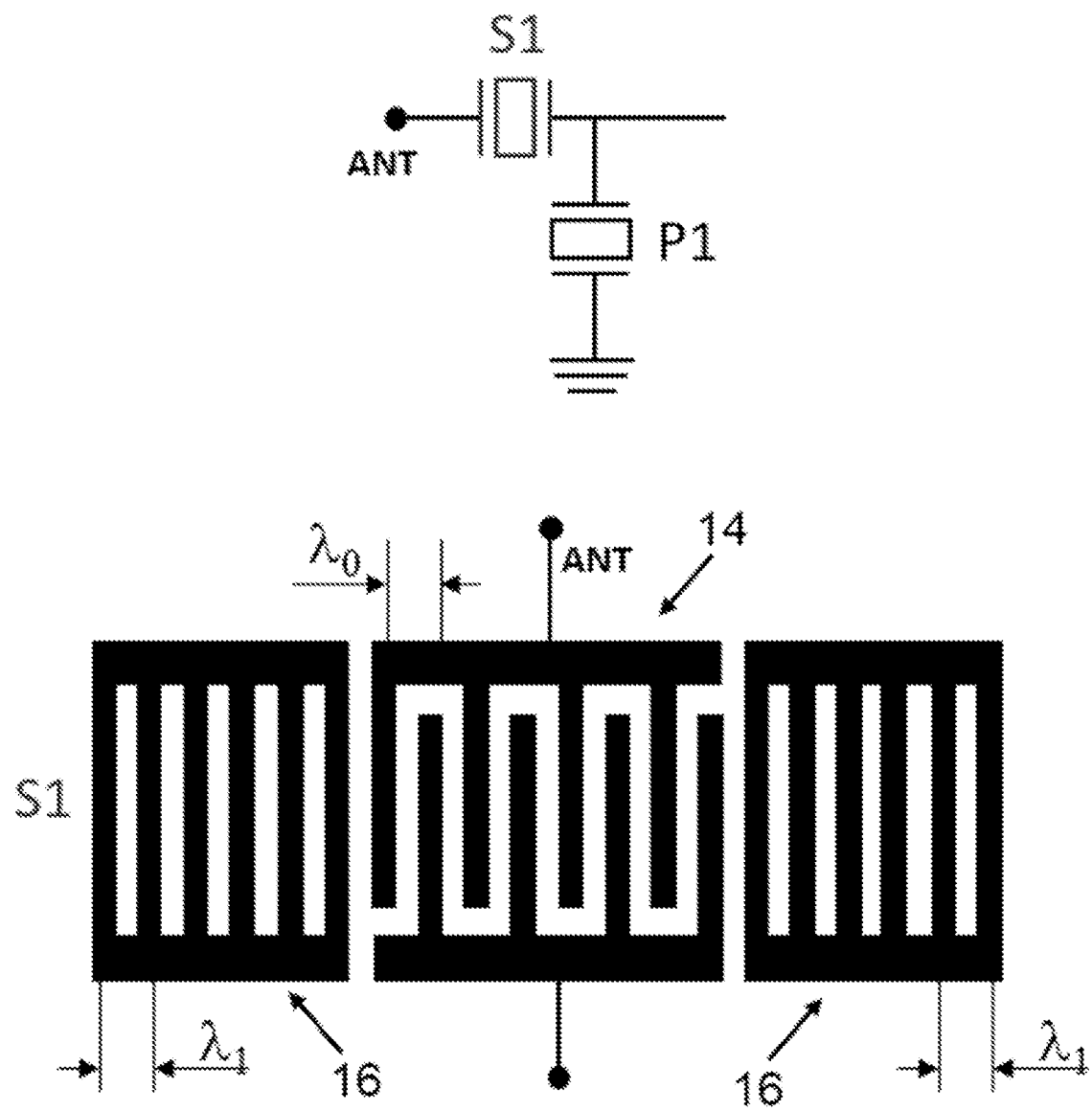
FIG. 4A illustrates a design of one example of a surface acoustic wave resonator of a ladder filter.

A solution in accordance with aspects of the present disclosure will now be described with reference to FIGS. 4A and 4B. As illustrated in FIG. 4A, in which S1 represents the first series acoustic resonator in a ladder filter and P1 represents the first parallel resonator closest to the antenna in the ladder filter, in many conventional SAW resonator designs the pitch of the reflector electrodes 16 on each side of the IDT electrodes 14 have the same pitch $\lambda_1$. The pitch $\lambda_1$ may be the same or different from the pitch $\lambda_0$ of the IDT electrodes 14.

Figure 4B:
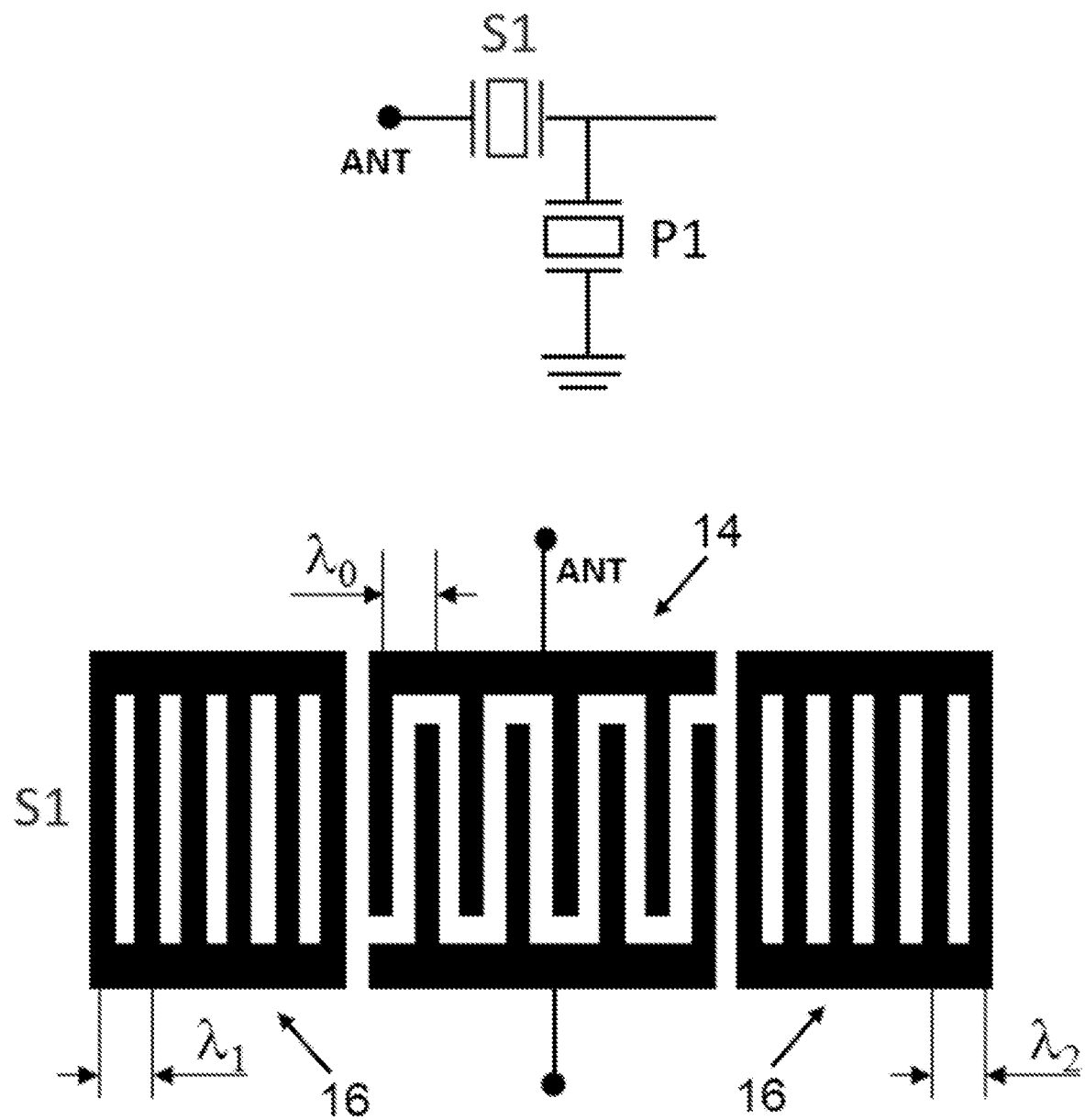
FIG. 4B illustrates a design of one example of a surface acoustic wave resonator of a ladder filter in accordance with an embodiment of the present disclosure.

In accordance with aspects disclosed herein the pitch of the electrode fingers of the two different reflector electrodes 16 may be set to different values $\lambda_1$ and $\lambda_2$ as illustrated in FIG. 4B. In some embodiments each of $\lambda_1$ and $\lambda_2$ are different from the IDT electrode pitch $\lambda_0$, but in other embodiments, one of $\lambda_1$ or $\lambda_2$ may be equal to $\lambda_0$. In some embodiments both of $\lambda_1$ and $\lambda_2$ are greater than the IDT electrode pitch $\lambda_0$, for example, up to 10% greater than $\lambda_0$. In other embodiments both of $\lambda_1$ and $\lambda_2$ are between about 1.02 and about 1.05 times $\lambda_0$. In some embodiments both of $\lambda_1$ and $\lambda_2$ are the same for substantially all or all of the electrode fingers in each respective reflector.

Figure 5:
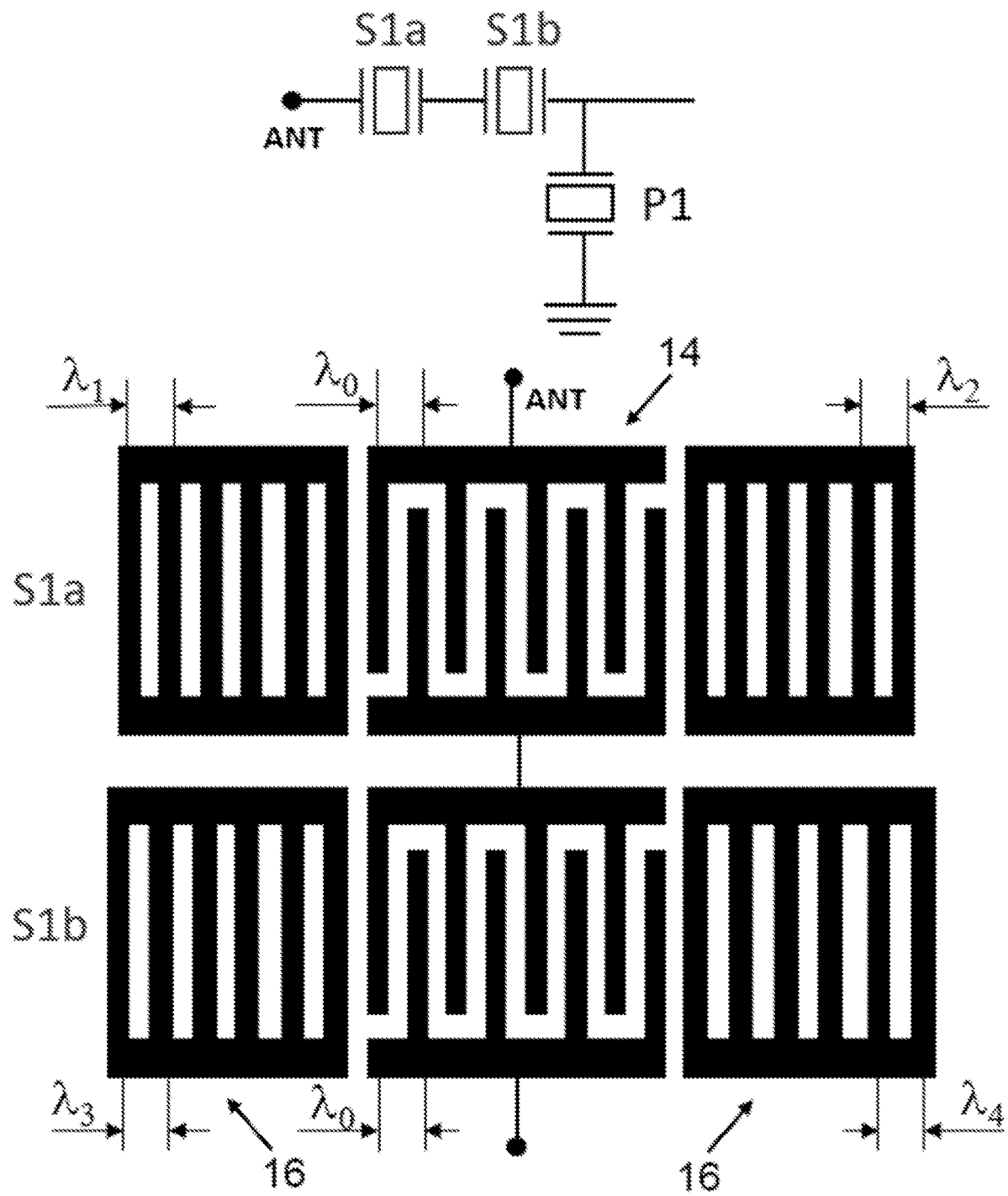
FIG. 5 illustrates a design of one example of cascaded surface acoustic wave resonators of a ladder filter in accordance with an embodiment of the present disclosure.

In further embodiments the first series acoustic resonator S1 in a ladder filter may be split into cascaded series resonators S1a and S1b as illustrated in FIG. 5. The pitches of the reflector electrodes in each of S1a and S1b are different from one another. In resonator S1a the pitch $\lambda_1$ of reflector electrodes in one reflector 16 is different from the pitch $\lambda_2$ of reflector electrodes in the other reflector 16. In resonator S1b the pitch $\lambda_3$ of reflector electrodes in one reflector 16 is different from the pitch $\lambda_4$ of reflector electrodes in the other reflector 16. The pitch $\lambda_0$ of the IDT electrodes 14 in each of S1a and S1b may be the same. In some embodiments one or more of $\lambda_1$, $\lambda_2$, $\lambda_3$, and $\lambda_4$ may be equal to the pitch of the IDT electrodes 14. In other embodiments, each of $\lambda_1$, $\lambda_2$, $\lambda_3$, and $\lambda_4$ is greater than the pitch $\lambda_0$ of the IDT electrodes 14, for example, up to 10% greater than or between about 1.02 and about 1.05 times $\lambda_0$. In some embodiments each of $\lambda_1$, $\lambda_2$, $\lambda_3$, and $\lambda_4$ are different, but in other embodiments the pitch of the reflector electrodes in one or both reflectors of S1a may match the pitch of the reflector electrodes in one or both reflectors of S1b. In some embodiments each of $\lambda_1$, $\lambda_2$, $\lambda_3$, and $\lambda_4$ are the same for substantially all or all of the electrode fingers in each respective reflector. For example, in some embodiments, $\lambda_1=\lambda_3$ or $\lambda_1=\lambda_4$ and/or $\lambda_2=\lambda_3$ or $\lambda_2=\lambda_3$, but $\lambda_1\neq\lambda_2$ and $\lambda_3\neq\lambda_4$. In further embodiments only one of S1a or S1b have reflectors with different electrode pitches and the electrode pitches of the reflectors of the other of S1a or S1b may be the same.

Figure 6A:
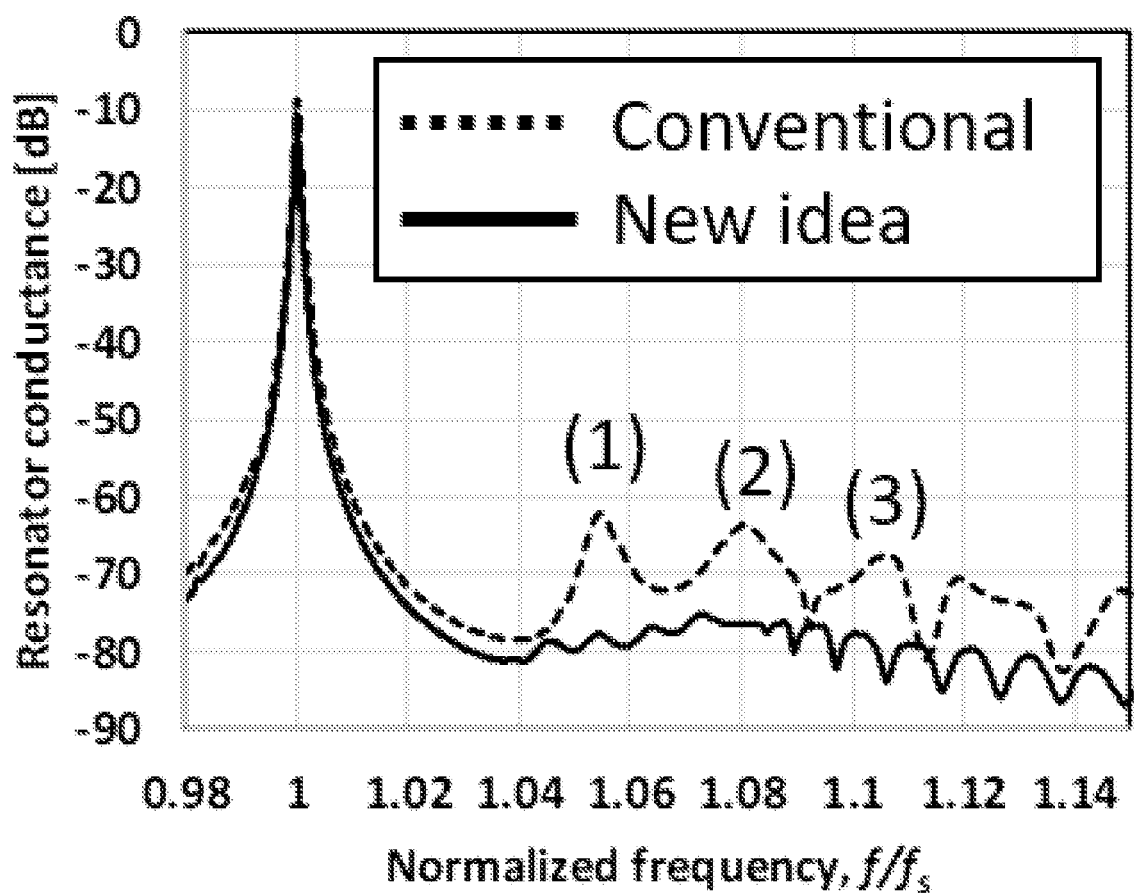
FIG. 6A illustrates results of a simulation comparing a conductance curve of cascaded surface acoustic wave resonators as disclosed herein with a conductance curve of a conventional surface acoustic wave resonator.
Figure 6B:
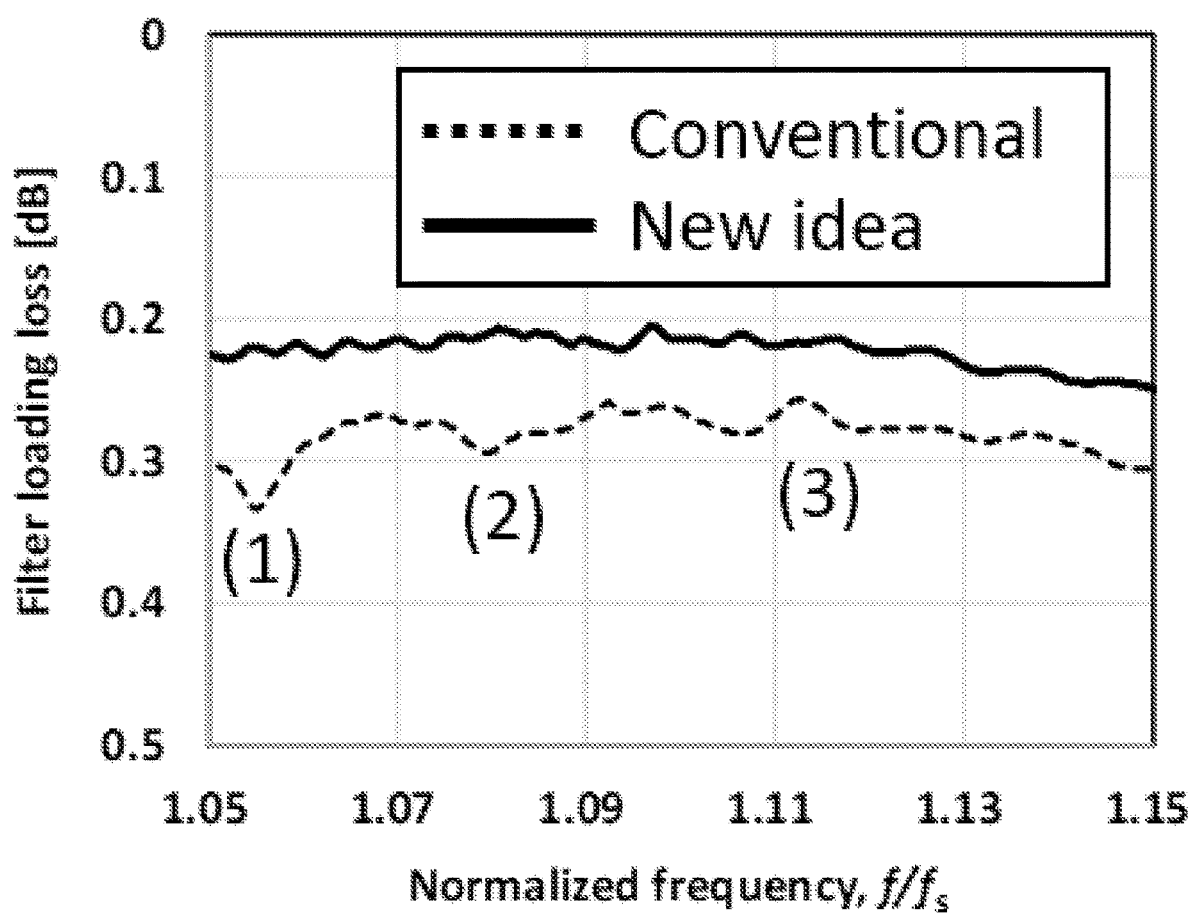
FIG. 6B illustrates results of a simulation comparing the filter loading loss of one filter in a device caused by a second filter in the device when the second filter includes either cascaded surface acoustic wave resonators as disclosed herein or a conventional first series surface acoustic wave resonator.

Simulations were performed to determine the effect of utilizing a SAW ladder filter in which the pitches of the reflector electrodes were set at different values from one another as illustrated in FIG. 5 as compared to a SAW ladder filter in which the pitches of the reflector electrodes were set at the same values as illustrated in FIG. 4A. The reflector electrode pitches in the simulation were set at $\lambda_1=1.02\ \lambda_0$, $\lambda_2=1.04\ \lambda_0$, $\lambda_3=1.03\ \lambda_0$, and $\lambda_4=1.05\ \lambda_0$. As illustrated by the simulation results in the chart of FIG. 6A, the ripples (1), (2), and (3) observed in a SAW resonator with a conventional design as illustrated in FIG. 4A were suppressed in a SAW resonator in which the pitches of the reflector electrodes were set at different values from one another as illustrated in FIG. 5 ("New idea" curve). Without being bound to a particular theory, it is believed that by utilizing reflector electrodes in a SAW resonator with different pitches, spurious conductance curve ripples generated in one reflector may offset spurious conductance curve ripples generated in the other reflector and flatten the resonator conductance curve. As illustrated in FIG. 6B the suppression of the conductance curve ripples reduces the filter loading loss in a second filter in a device that may experience crosstalk with a first filter including a first series SAW resonator with unequal reflector electrode pitches as illustrated in FIG. 5.

Figure 7:
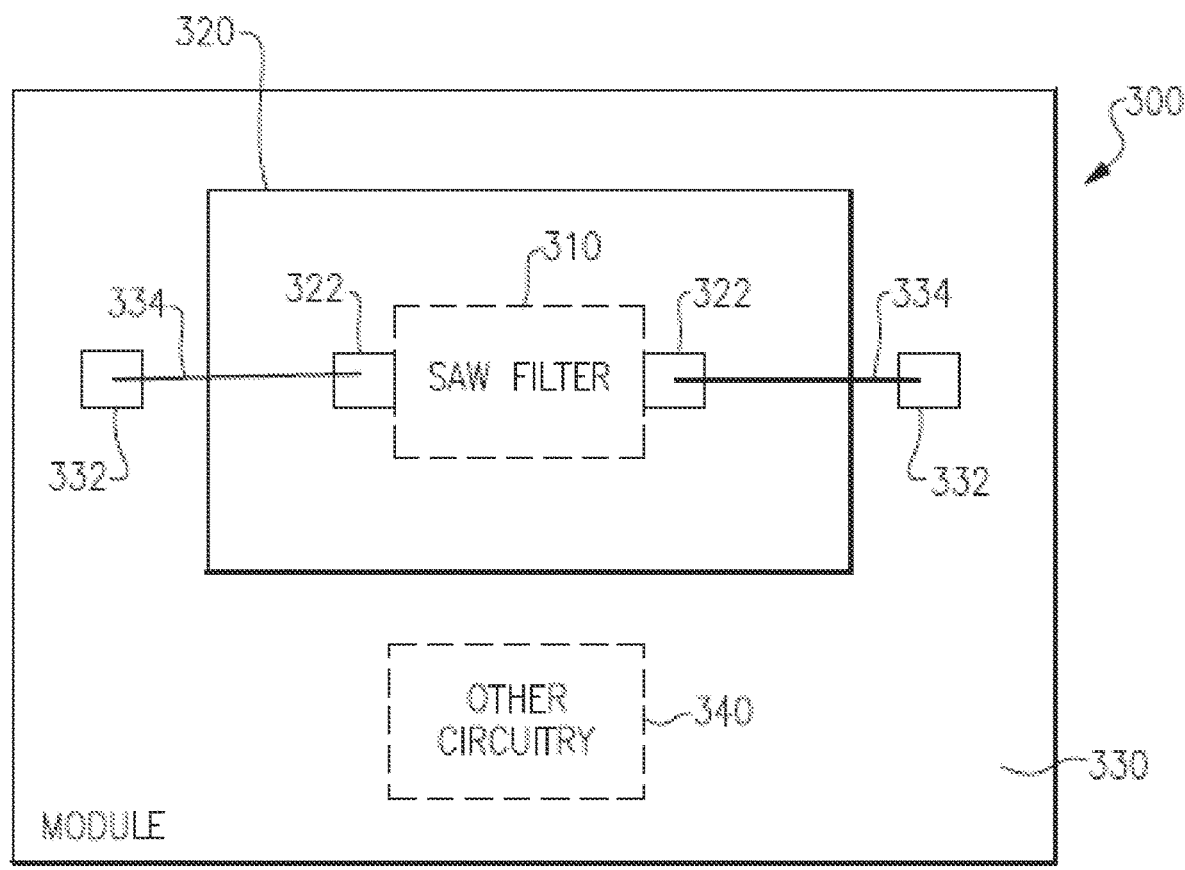
FIG. 7 is a block diagram of one example of a filter module that can include one or more surface acoustic wave elements according to aspects of the present disclosure.
Figure 8:
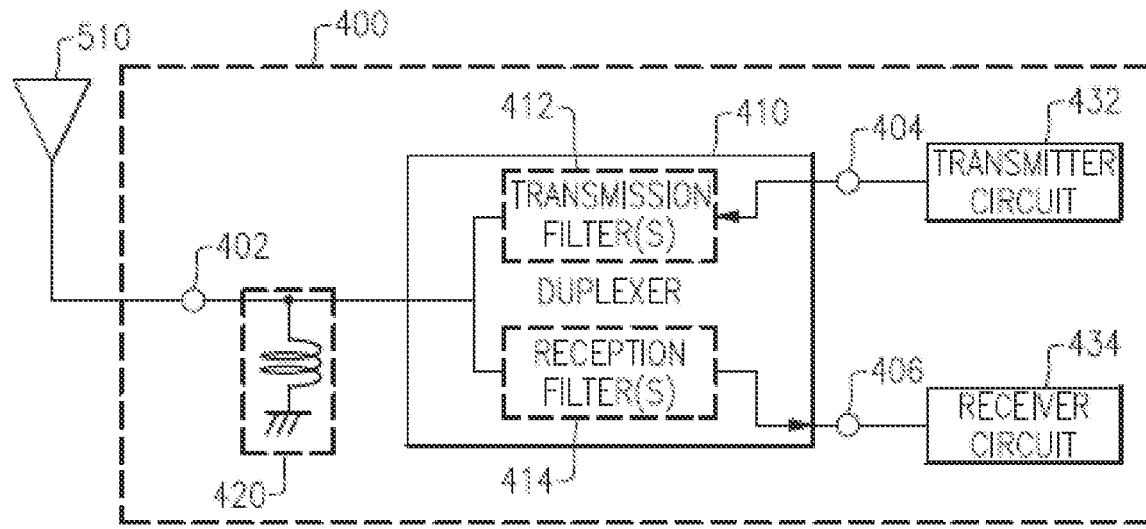
FIG. 8 is a block diagram of one example of a front-end module that can include one or more filter modules according to aspects of the present disclosure.
Figure 9:
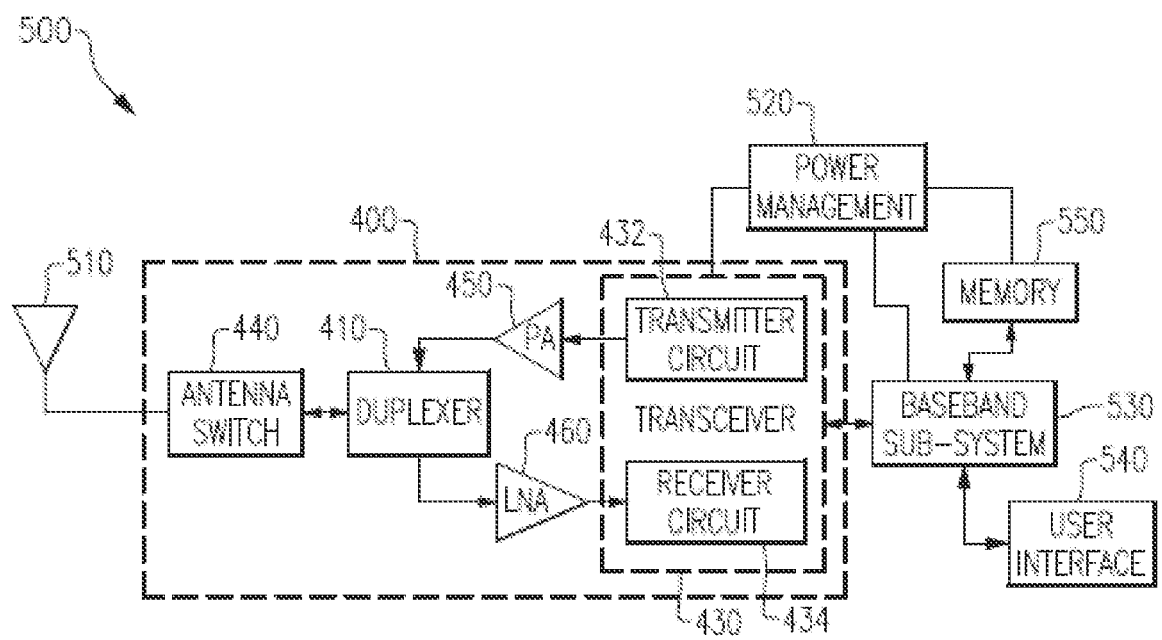
FIG. 9 is a block diagram of one example of a wireless device including the front-end module of FIG. 8.

The surface acoustic wave devices discussed herein can be implemented in a variety of packaged modules. Some example packaged modules will now be discussed in which any suitable principles and advantages of the packaged acoustic wave devices discussed herein can be implemented. FIGS. 7, 8, and 9 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 7 is a block diagram illustrating one example of a module 300 including a SAW filter 310. The SAW filter 310 may be implemented on one or more die(s) 320 including one or more connection pads 322. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310. The module 300 may optionally further include other circuitry die 340, such as, for example one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Referring to FIG. 8, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 8, however in other embodiments these components may be integrated into a common transceiver circuit or module. As will be appreciated by those skilled in the art, the front-end module 400 may include other components that are not illustrated in FIG. 8 including, but not limited to, switches, electromagnetic couplers, amplifiers, processors, and the like.

FIG. 9 is a block diagram of one example of a wireless device 500 including the antenna duplexer 410 shown in FIG. 8. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 8. The front-end module 400 includes the duplexer 410, as discussed above. In the example shown in FIG. 9 the front-end module 400 further includes an antenna switch 440, which can be configured to switch between different frequency bands or modes, such as transmit and receive modes, for example. In the example illustrated in FIG. 9, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 8.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 9, the front-end module 400 may further include a low noise amplifier module 460, which amplifies received signals from the antenna 510 and provides the amplified signals to the receiver circuit 434 of the transceiver 430.

The wireless device 500 of FIG. 9 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a piezoelectric substrate;
interdigital transducer electrodes having an electrode pitch $\lambda_0$;
first and second reflector gratings disposed on opposite respective sides of the interdigital transducer electrodes in a propagation direction of a main acoustic wave through the acoustic wave device, the first reflector grating having a reflector electrode pitch $\lambda_1$ throughout an entirety of the first reflector grating that is different than a reflector electrode pitch $\lambda_2$ throughout an entirety of the second reflector grating to suppress ripples in a conductance curve of the acoustic wave device, each of $\lambda_1$ and $\lambda_2$ being greater than $\lambda_0$ by between about 2% and about 5%.

2. The acoustic wave device of claim 1 further comprising:
- second interdigital transducer electrodes in series with the interdigital transducer electrodes; and
- third and fourth reflector gratings disposed on opposite respective sides of the second interdigital transducer electrodes in the propagation direction, the third reflector grating having a different electrode pitch $\lambda_3$ than an electrode pitch $\lambda_4$ of the fourth reflector grating.

3. The acoustic wave device of claim 2 wherein $\lambda_1$ is equal to one of $\lambda_3$ or $\lambda_4$.

4. The acoustic wave device of claim 3 wherein $\lambda_2$ is equal to one of $\lambda_3$ or $\lambda_4$.

5. The acoustic wave device of claim 2 wherein each of $\lambda_1$, $\lambda_2$, $\lambda_3$, and $\lambda_4$ is different.

6. An electronic device including at least two filters coupled to an antenna node, a first of the at least two filters being a ladder filter having a series resonator closest to the antenna node, the series resonator comprising:
- a piezoelectric substrate;
- interdigital transducer electrodes having an electrode pitch $\lambda_0$;
- first and second reflector gratings disposed on opposite respective sides of the interdigital transducer electrodes in a propagation direction of a main acoustic wave through the acoustic wave device, the first reflector grating having a reflector electrode pitch $\lambda_1$ throughout an entirety of the first reflector grating that is different than a reflector electrode pitch $\lambda_2$ throughout an entirety of the second reflector grating to suppress ripples in a conductance curve of the acoustic wave device;
- second interdigital transducer electrodes in series with the interdigital transducer electrodes; and
- third and fourth reflector gratings disposed on opposite respective sides of the second interdigital transducer electrodes in the propagation direction, the third reflector grating having a different electrode pitch $\lambda_3$ than an electrode pitch $\lambda_4$ of the fourth reflector grating, each of $\lambda_1$, $\lambda_2$, $\lambda_3$, and $\lambda_4$ being different.

7. The electronic device of claim 6 wherein each of $\lambda_1$ and $\lambda_2$ is greater than $\lambda_0$.

8. The electronic device of claim 7 wherein each of $\lambda_1$ and $\lambda_2$ is greater than $\lambda_0$ by between about 2% and about 5%.

9. The electronic device of claim 6 wherein each of $\lambda_3$, and $\lambda_1$ is greater than an electrode pitch of the second interdigital transducer electrodes.

10. An electronic device comprising an electronics module including a radio frequency filter, the radio frequency filter including an acoustic wave device including a piezoelectric substrate, interdigital transducer electrodes having an electrode pitch $\lambda_0$, and first and second reflector gratings disposed on opposite respective sides of the interdigital transducer electrodes in a propagation direction of a main acoustic wave through the acoustic wave device, the first reflector grating having a reflector electrode pitch $\lambda_1$ throughout an entirety of the first reflector grating that is different than a reflector electrode pitch $\lambda_2$ throughout an entirety of the second reflector grating to suppress ripples in a conductance curve of the acoustic wave device, second interdigital transducer electrodes in series with the interdigital transducer electrodes, and third and fourth reflector gratings disposed on opposite respective sides of the second interdigital transducer electrodes in the propagation direction, the third reflector grating having a different electrode pitch $\lambda_3$ than an electrode pitch $\lambda_4$ of the fourth reflector grating, each of $\lambda_1$, $\lambda_2$, $\lambda_3$, and $\lambda_4$ being different.

11. The electronic device of claim 10 wherein one of $\lambda_1$ or $\lambda_2$ is equal to $\lambda_0$.

12. The electronic device of claim 10 wherein each of $\lambda_1$ and $\lambda_2$ is different from $\lambda_0$.

13. The acoustic wave device of claim 12 wherein each of $\lambda_1$ and $\lambda_2$ is greater than $\lambda_0$.

* * * * *

UNITED STATES PATENT AND TRADEMARK OFFICE
CERTIFICATE OF CORRECTION

PATENT NO. : 12,278,612 B2
APPLICATION NO. : 18/419025
DATED : April 15, 2025
INVENTOR(S) : Xiao Zhang et al.

Page 1 of 1

It is certified that error appears in the above-identified patent and that said Letters Patent is hereby corrected as shown below:

In the Claims

Column 12, Line 34, Claim 13, delete "acoustic wave" and insert -- electronic --

Signed and Sealed this
Twentieth Day of May, 2025

Coke Morgan Stewart
*Acting Director of the United States Patent and Trademark Office*